(12) United States Patent
Gabara (10) Patent No.: US 6,326,821 B1
(45) Date of Patent: Dec. 4, 2001

(54) LINEARLY-CONTROLLED RESISTIVE ELEMENT APPARATUS

(75) Inventor: Thaddeus John Gabara, Murray Hill, NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/083,172

(22) Filed: May 22, 1998

(51) Int. Cl.$^7$ ........................................... H03K 3/00
(52) U.S. Cl. ................ 327/112; 327/278; 327/288; 327/404; 326/85
(58) Field of Search ....................... 327/108, 109, 327/112, 365, 374, 376, 392–395, 399, 403–405, 513, 261, 276, 278, 288; 326/26–28, 82, 83, 85, 87; 307/412

(56) References Cited

U.S. PATENT DOCUMENTS

| | | | |
|---|---|---|---|
| 5,001,369 | * 3/1991 | Lee | 326/58 |
| 5,194,765 | 3/1993 | Dunlop et al. | 326/87 |
| 5,220,216 | 6/1993 | Woo | 326/50 |
| 5,243,229 | 9/1993 | Gabara et al. | 307/98 |
| 5,258,663 | * 11/1993 | Tamaki | 327/546 |
| 5,589,789 | 12/1996 | Kamiya | 327/278 |
| 5,621,335 | 4/1997 | Andresen | 326/30 |
| 5,917,358 | * 6/1999 | Sanchez et al. | 327/333 |

FOREIGN PATENT DOCUMENTS

| | | | |
|---|---|---|---|
| 253914 | 7/1986 | (EP) | H03K/19/00 |
| 752677 | 1/1997 | (EP) | G06F/17/50 |

OTHER PUBLICATIONS

T.J. Gabara and S.C. Knauer, "Digitally Adjustable Resistors in CMOS for High–Performance Applications," *IEEE Journal of Solid–State Circuits*, vol. 27, No. 8, Aug. 1992, pp. 1176–1185.

* cited by examiner

*Primary Examiner*—Timothy P. Callahan
*Assistant Examiner*—Minh Nyuyen
(74) *Attorney, Agent, or Firm*—John M. Harman; Nancy R. Gamburd (57) ABSTRACT

Embodiments of the invention include an integrated circuit output buffer, with a pre-drive stage and an output driver stage, that provides linear performance independent of the load impedance. The output driver stage includes a pull-up resistor arrangement having a plurality of branches connected in parallel and, alternatively at least one pull-down resistor arrangement having a plurality of branches connected in parallel. The branches of the pull-up resistor arrangement include at least one resistor and at least one transistor serially connected between a supply voltage and the output buffer output terminal connectable to the PAD external to the output buffer. The transistor in the pull-up arrangement is connected to both the data terminals from the pre-drive stage and the control bit terminals.

16 Claims, 6 Drawing Sheets

LINEARLY-CONTROLLED RESISTIVE ELEMENT APPARATUS

BACKGROUND OF THE INVENTION

1. Field of the Invention

The invention relates to the output buffer portion of integrated circuit devices. More particularly, the invention relates to the control of the impedance of an integrated circuit device output buffer.

2. Description of the Related Art

The increase in the operating speeds of integrated circuits (ICs) has resulted in faster rise and fall times of output voltages in response to inputs generating more system switching noise. Controlling output edge rates and output impedances is required to minimize this noise when transmitting data, e.g., at high rates. The characteristics of output voltages typically are a function of, e.g., temperature variations, process variations and voltage variations (i.e., PVT variations). Another important factor includes the actual load presented to an output terminal. For applications such as adding devices to transmission lines, it is desirable for the impedance of the output driver as seen by the PAD to be constant despite the output driver output waveform, i.e., despite varying output driver output voltage values. Furthermore, it is desirable for the impedance of the output driver to match the load impedance of the transmission line. See, e.g., Gabara et al., "Digitally Adjustable Resistors in CMOS for High-Performance Applications", IEEE Journal of Solid-State Circuits, Vol. 27, No. 8, August 1992, pp. 1176–1185.

Conventional systems use, e.g., arrangements that include constant current sources and some type of analog circuitry to address the problems of variations of the output characteristics as a function of load. However, such conventional systems typically require a higher power drain due to the use of the constant current sources and analog circuitry fabricated on the integrated circuit. With most complementary metal-oxide semiconductor (CMOS) systems, such arrangement is relatively difficult to implement and often requires the use of bipolar-CMOS (BiCMOS) technology in order to realize these functions.

Alternatively, conventional integrated circuit (IC) output buffers include, e.g., a pre-driver stage and an output driver stage. The output driver stage includes a plurality of control bit terminals and a PAD operably connected thereto. Conventional output drivers use single transistors as the pull-up and pull-down resistors within the output driver stage. However, the performance of these pull-up and pull-down resistor arrangements typically is non-linear across the operating voltage swing at the PAD. Also, the non-linear performance is dependent on external factors such as the aforementioned PVT variations. See a discussion of such problems, e.g., in U.S. Pat. Nos. 5,194,765 and 5,243,229.

Therefore, a need exists for a method and apparatus for controlling the output impedance such that it can be maintained within acceptable limits independent of the voltage swing at the PAD and independent of PVT variations.

SUMMARY OF THE INVENTION

The invention is embodied in an integrated circuit output buffer having linear performance independent of the voltage swing. Embodiments of the invention provide an integrated circuit output buffer having a pre-drive stage and an output driver stage. The output driver stage includes a pull-up resistor arrangement having a plurality of branches connected in parallel and, alternatively at least one pull-down resistor arrangement having a plurality of branches connected in parallel. According to an embodiment of the invention, the branches of the pull-up resistor arrangement include at least one resistor and at least one transistor serially connected between a supply voltage and the output buffer output terminal connectable to the PAD external to the output buffer. The transistor in the pull-up arrangement is connected to both the data terminals from the pre-drive stage and the control bit terminals. According to another embodiment of the invention, the branches of the pull-down resistor arrangement include a resistor and at least one transistor serially connected between the ground voltage potential of the integrated circuit and the output buffer output terminal that is to be connected to the PAD. The transistor in the pull-down arrangement is connected to both data terminals from the pre-drive stage and control bit terminals. Alternatively, the pull-up transistor is replaced by a pair of transistors, e.g., a pull-up control transistor and a pull-up data transistor. Similarly, according to another alternative embodiment of the invention, the pull-down transistor is replaced by a pull-down control transistor and a pull-down data transistor. Control information received from the control bit terminals cause the resistance of the output buffer to be adjusted in a manner that compensates for variations in ambient temperature, operating voltage and processing variations (i.e., PVT variations). In this manner, the novel resistor and transistor arrangements provide output buffer performance that is linear across the operating voltage range of the output driver (e.g., 0.75–1.50 volts) and that is independent of external factors such as PVT variations.

BRIEF DESCRIPTION OF THE DRAWINGS

The nature, advantages and various additional features of the invention will appear more fully upon consideration of the illustrative embodiments now to be described in detail in the accompanying drawings. In the drawings.

DETAILED DESCRIPTION

In the following description similar components are referred to by the same reference numeral in order to enhance the understanding of the invention through the description of the drawings.

Although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

According to embodiments of the invention, inventive resistor and transistor arrangements within integrated circuit output buffers offer improved performance. The inventive resistor and transistor arrangements are used instead of conventional pull-up and/or pull-down transistors. Furthermore, digital control signals are applied to the inventive arrangements via control bit terminals to adjust the resistance of the output buffer in a manner that compensates for variations in ambient temperature, operating voltage and processing variations (i.e., PVT variations). In this manner, the novel resistor and transistor arrangements provide output buffer performance that is linear across the operating voltage range of the output driver (e.g., 0.75–1.50 volts) and that is independent of external factors such as PVT variations.

Figure 1:
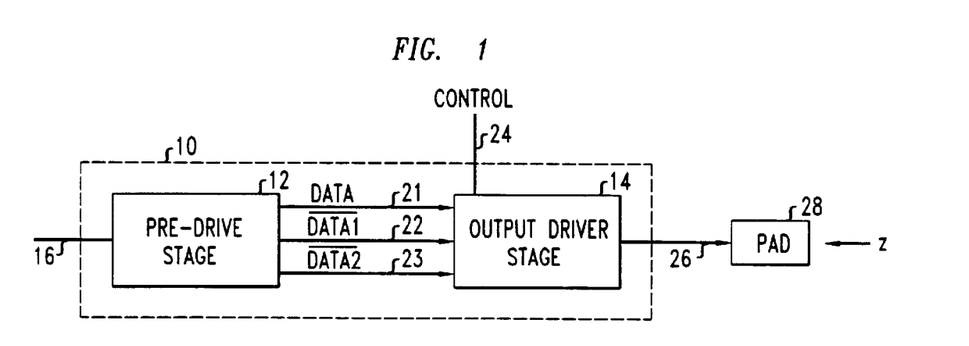
FIG. 1 is a simplified block diagram of an integrated circuit (IC) output buffer.

Referring now to FIG. 1, an integrated circuit (IC) output buffer 10 is shown. Output buffer 10 includes a pre-drive stage 12 and an output driver stage 14. The pre-drive stage 12 includes an input terminal 16, e.g., a plurality of input terminals receiving signals from other previous integrated circuit stages. The pre-drive stage 12 is coupled to the output driver stage 14 via a plurality of direct connections. The connections are labeled, e.g., as a data terminal 21, a first $\overline{data1}$ terminal 22 and a second $\overline{data2}$ terminal 23. Typically, the first $\overline{data1}$ terminal 22 and the second $\overline{data2}$ terminal 23 represent the inverse of the data terminal 21, however, it is possible for one or both of them to be independent of the data terminal 21.

The output driver stage 14 includes one or more control bit terminals or control bit input terminals 24, e.g., for providing digital control bit information that enables pertinent portions of the output driver stage 14 to respond to the information on the data terminals 21–23. The digital control bit information is generated, e.g., from a reference circuit that compares all or a portion of the output driver stage 14 to a discrete reference resistance value.

Also, the output driver stage 14 includes an output terminal 26, e.g., a PAD 28 or other suitable terminal area. The PAD 28 typically is used for providing the connection between the output driver stage 14 and, e.g., a transmission line (not shown) or the wiring interconnects between packaged devices (not shown), which could be modeled as a transmission line.

Figure 2A:
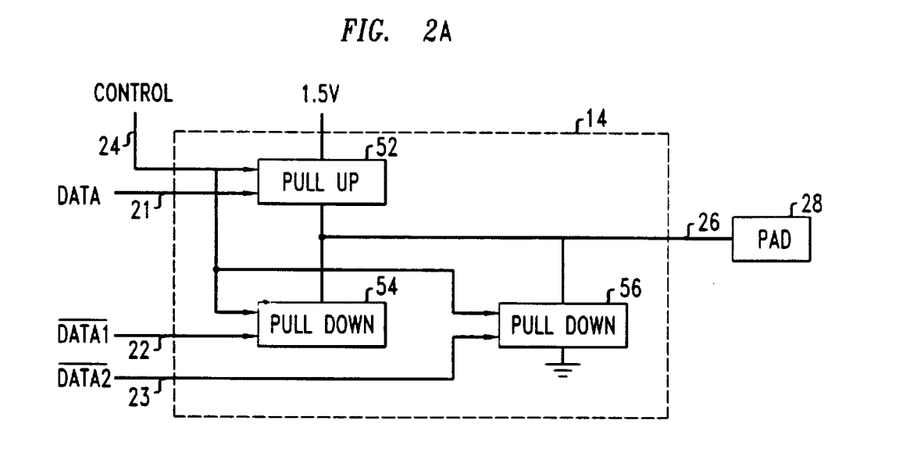
FIG. 2a is a simplified block diagram of the output driver portion of the integrated circuit (IC) output buffer shown in FIG. 1 according to an embodiment of the invention.
Figure 2B:
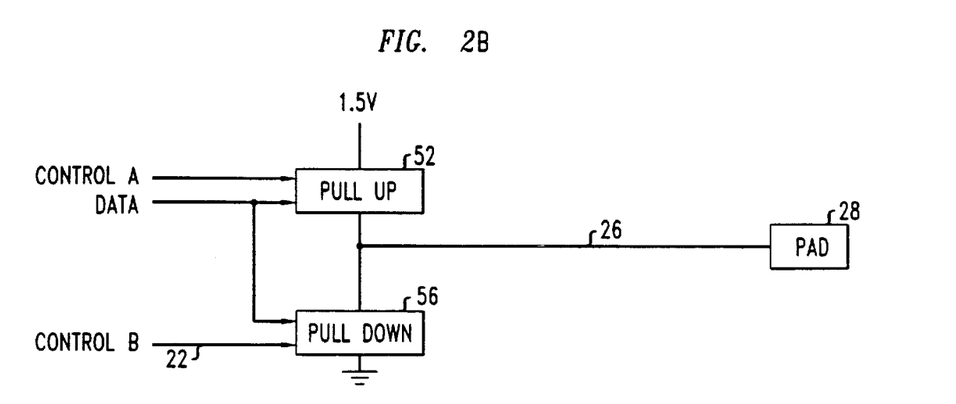
FIG. 2b is a simplified block diagram of the output driver portion of the integrated circuit (IC) output buffer shown in FIG. 1 according to another embodiment of the invention.

Referring now to FIG. 2a, a schematic diagram of the output driver stage 14 of the integrated circuit (IC) output buffer 10 according to embodiments of the invention is shown. The output driver stage 14 includes pull-up and pull-down resistor arrangements. For example, shown in FIG. 2a is a pull-up resistor arrangement 52, a first pull-down resistor arrangement 54, and a second pull-down resistor arrangement 56. The pull-up resistor arrangement 52 has connected thereto the data terminal 21 and one or more control bit input terminals 24 of the output driver stage 14. Although the control bit input terminals 24 are shown originating from a single source, it is possible for the control bit input terminals to originate from separate (different) sources. See, e.g., FIG. 2b. Also, the pull-up resistor arrangement 52 is connected to a supply voltage, e.g., approximately 1.5 volts, and is connected to the PAD output terminal 26.

The first pull-down resistor arrangement 54 has connected thereto the first $\overline{data1}$ terminal 22 and the control bits input terminal 24 of the output driver stage 14. As mentioned previously herein, although the control bit input terminals 24 are shown originating from a single source, it is possible for the control bit input terminals to originate from separate sources. Also, the first pull-down resistor arrangement 54 is connected to the ground voltage potential of the integrated circuit and, like the pull-up resistor arrangement 52, is connected to the PAD output terminal 26.

The second pull-down resistor arrangement 56 has connected thereto the second $\overline{data2}$ terminal 23 and the control bits input terminal 24 of the output driver stage 14. Also, the second pull-down resistor arrangement 56 is connected to the ground voltage potential of the integrated circuit and, like the pull-up resistor arrangement 52 and the first pull-down resistor arrangement 54, is connected to the PAD output terminal 26.

Figure 3:
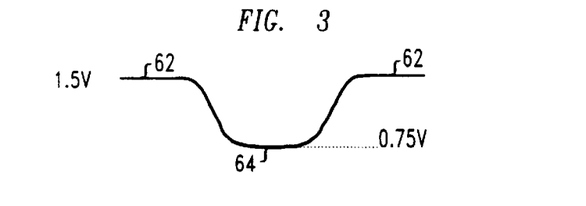
FIG. 3 is a graphical diagram of a typical output driver output waveform showing varying output driver output values.

As stated previously herein, it is desirable for the impedance of the output driver stage 14 as seen by the PAD 28 to be constant despite the voltage value of the output driver. A typically output driver output waveform is shown, e.g., in FIG. 3. The value of the output driver output waveform varies, e.g., from approximately 1.5 volts (shown generally as 62) to approximately 0.75 volts (shown generally as 64), depending on the desired output voltage state.

Figure 4:
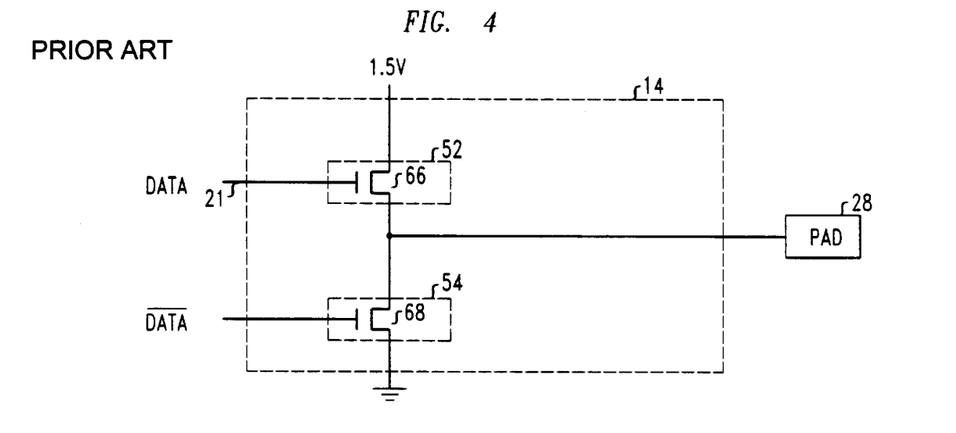
FIG. 4 is a schematic diagram showing conventional pull-up and pull-down resistor arrangements.

Conventionally, as shown in FIG. 4, within the output driver stage 14, the pull-up resistor arrangement 52 has a single transistor therein, e.g., a single N-channel transistor device 66. Similarly, the pull-down resistor arrangement 54 has a single transistor therein, e.g., a single N-channel transistor device 68. The gate of transistor device 66 is connected to, e.g., the data terminal 21 and the gate of the transistor device 68 is connected to a $\overline{data}$ terminal, which is, e.g., the first $\overline{data1}$ terminal 22 or the second $\overline{data2}$ terminal 23.

Figure 5A:
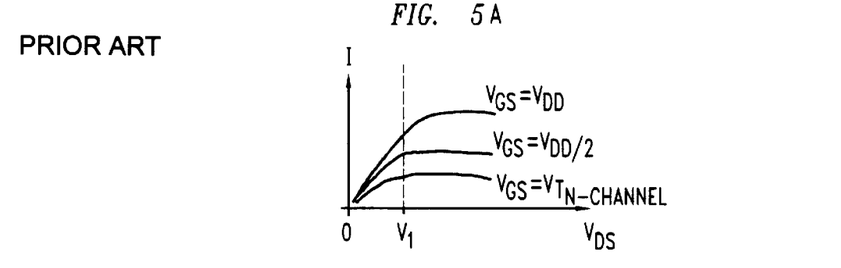
FIG. 5a–b are graphical diagrams of current vs. voltage for conventional pull-up and pull-down resistor arrangements showing the non-linear performance thereof across the operating voltage range of the output driver output voltage.
Figure 5B:
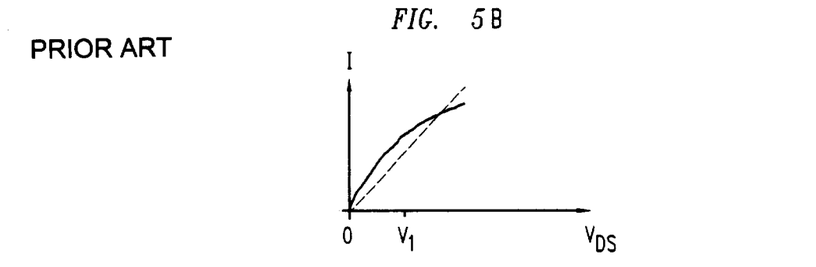

However, as illustrated in the graphs of FIGS. 5a–b, the performance of the output buffer employing conventional pull-up and pull-down resistor arrangements is non-linear across the operating voltage range of the output driver output voltage. In FIG. 5a, it is shown that, as the drain-to-source voltage, $V_{DS}$, of the transistor in question increases, the current flowing therethrough increases and then levels out for various gate-to-source transistor voltages. Although for a limited drain-to-source voltage range (i.e., from $V_{DS}$=0 to VDS=$V_1$), the current response appears relatively linear, FIG. 5b illustrates that such current response in not linear when compared to a theoretical linear response.

According to embodiments of the invention, the digital control inputs are connected directly with the inventive pull-up and pull-down resistor arrangements to improve the linearity of the output buffer performance across the operating voltage range of the output driver (e.g., 1.50 to 0.75 volts). As mentioned previously herein, the digital control bit information is generated, e.g., from a reference circuit that compares a pull-up and/or pull-down resistor arrangement to a discrete reference resistance value. The digital control information control is varied in such a way that the voltage drop across the arrangements is the same as the voltage drop across the PAD 28 and its reference resistor (not shown). In this manner, the linearity of the output buffer is independent of external factors such as variations in ambient temperature, operating voltage and processing variations (i.e., PVT variations).

Figure 6:
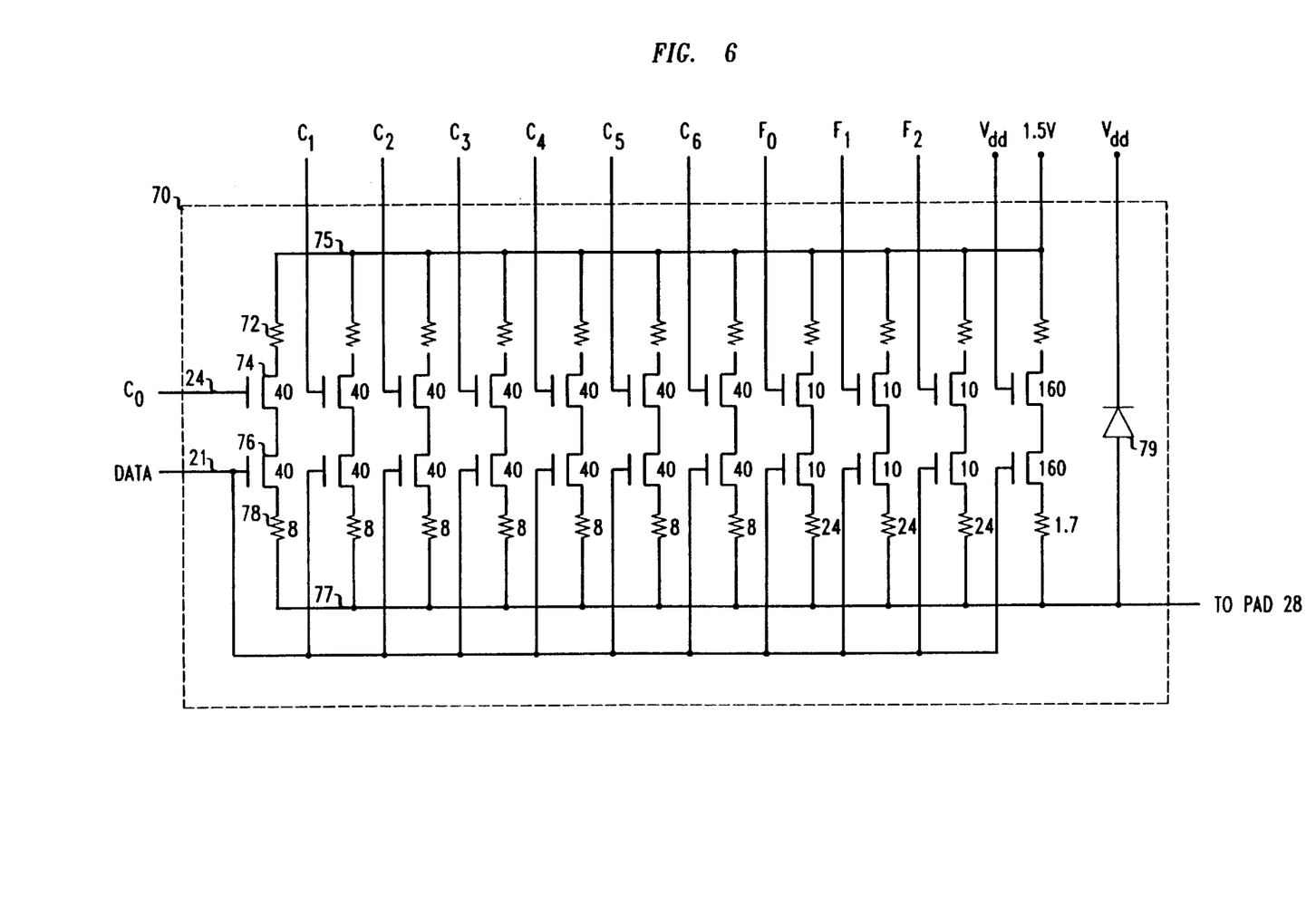
FIG. 6 is a schematic diagram of a pull-up resistor arrangement according to an embodiment of the invention.
Figure 7A:
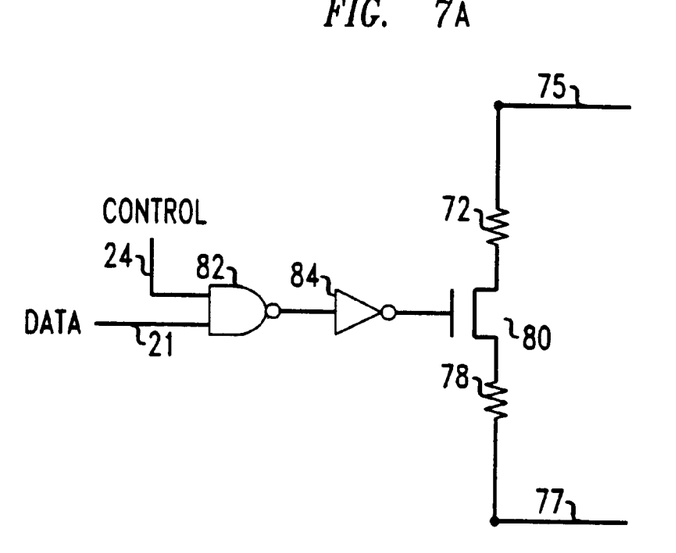
FIG. 7a is a schematic diagram of a resistor arrangement according to an alternative embodiment of the invention.
Figure 7B:
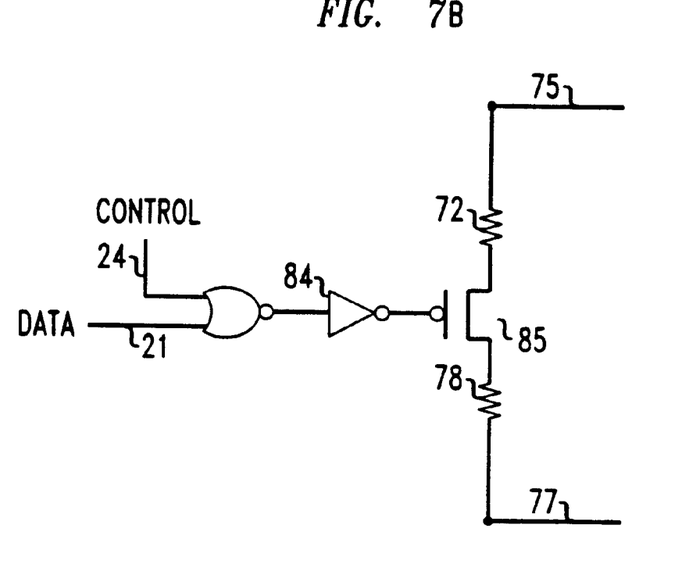
FIG. 7b is a schematic diagram of a resistor arrangement according to an another alternative embodiment of the invention.
Figure 8:
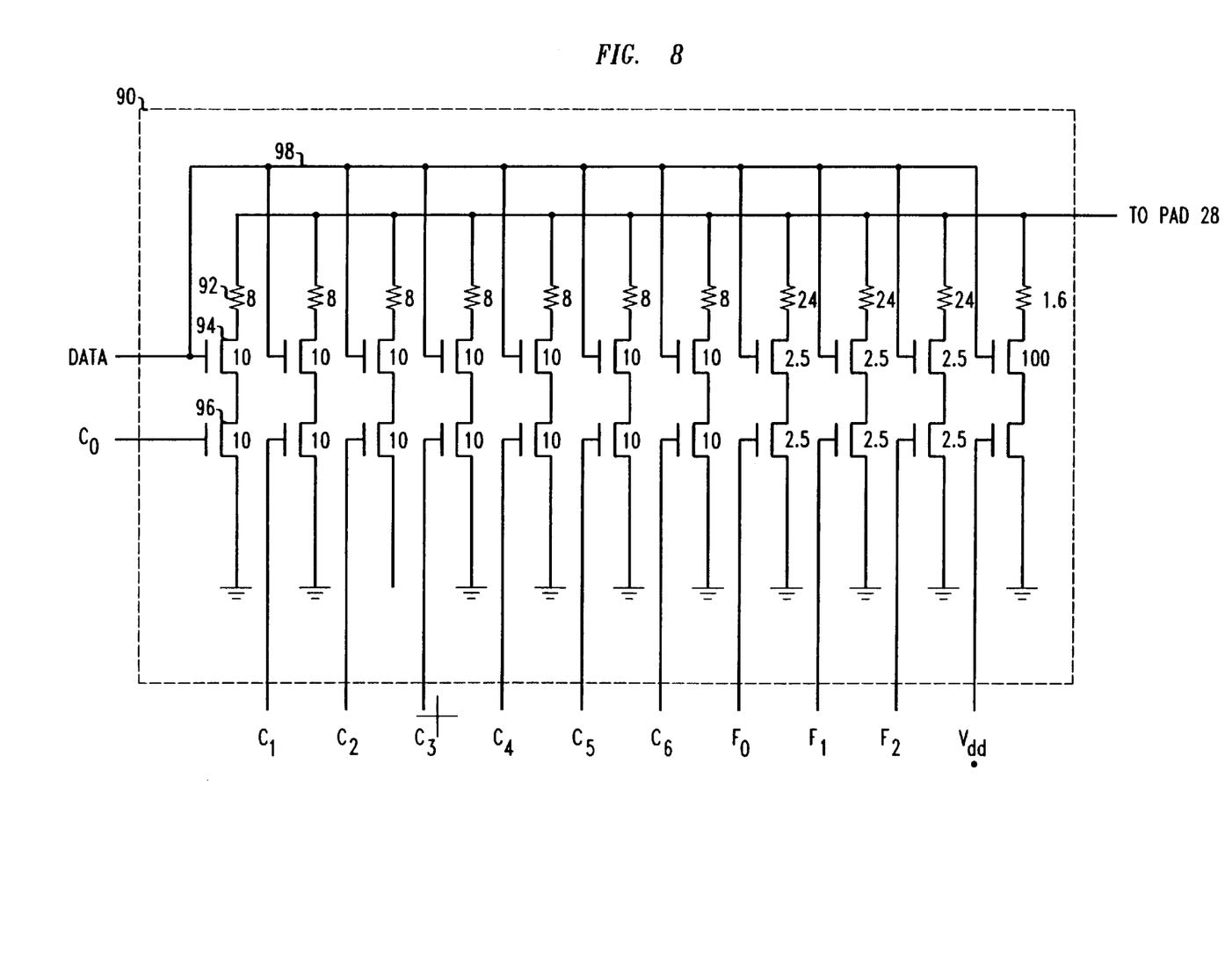
FIG. 8 is a schematic diagram of a pull-down resistor arrangement according to an embodiment of the invention.

Also, according to embodiments of the invention, inventive pull-up and pull-down resistor arrangements are provided, including the pull-up resistor arrangements 70 shown in FIGS. 6, 7*a–b* and the pull-down resistor arrangement shown in FIG. 8. The inventive pull-up and pull-down resistor arrangements include a plurality of (transistor) branches or legs connected in parallel. According to embodiments of the invention, the number of branches within a particular arrangement varies, but should include as many branches as possible. However, the number of branches in a particular arrangement should give consideration to the corresponding increase in integrated circuit area that is required for the arrangement. Resistor arrangements according to embodiments of the invention typically have approximately ten (10) branches but can have as few as four (4) branches.

Referring now to FIG. 6, the pull-up resistor arrangement 70 according to an embodiment of the invention is shown having, e.g., eleven (11) branches connected in parallel between the supply voltage rail 75 and the output rail 77. More specifically, the pull-up resistor arrangement 70 is shown having seven (7) coarse tuning branches, three (3) fine tuning branches, and one (1) single fixed resistance branch. Also, alternatively, a diode 79 is connected between a source voltage, $V_{DD}$, and the output rail 77 for protection from electrostatic discharge (ESD).

A single branch includes, e.g., a first control transistor 74 (e.g., a N-channel device), a second data transistor 76, and a resistor 78 connected as shown. Alternatively, for ESD protection, an additional resistor 72 is connected between the first control transistor 74 and the supply voltage rail 75 and the drain of the first control transistor 74.

Connected to the gate of the first control transistor 74 is a control bit terminal, e.g., one of the seven coarse control bit terminals ($c_0, c_1, c_2, c_3, c_4, c_5, c_6$) or one of the three fine control bit terminals ($f_0, f_1, f_2$). The gate of the first control transistor 74 in the single fixed resistance branch is connected to, e.g., source voltage $V_{DD}$.

The source of the first control transistor 74 is connected to the drain of the second data transistor 76, which, e.g., also is a N-channel device. Connected to the gate of the second data transistor 76 is the data terminal 21. The source of the second data transistor 76 is connected to the second resistor 78, which is connected as shown between the second data transistor 76 and an output rail 77 that is connectable with, e.g., the PAD 28, which is external to the output driver stage 14.

In operation, a branch is enabled when both the control bit (i.e., the control bit terminal) and the data bit (i.e., the data bit terminal) are both set to a logic high ("1"), e.g., $V_{DD}$. It should be noted that if the data terminal 21 is set to a logical low ("0"), e.g., $V_{SS}$, all branches are disabled. Thus, the control bit terminals enable a branch depending on the logical value of the data terminal 21. If all the control bits are set to logical low and the data terminal 21 is set to logical high, the only enabled path will be the single fixed resistance branch, which remains enabled by virtue of its connection to $V_{DD}$. If all the control bits are set to logical high and the data terminal 21 is set to logical low, all branches are enabled.

The table set forth below characterizes the behavior of the control bits as a function of pressure, voltage and temperature (PVT) for a conventional 0.35 $\mu$m process. The first letter of the three letter characterization defines the process (f=fast, t=typical, s=slow), the second letter defines the power supply voltage (h=1.5 volts+5% and 3.3 volts +5%, t=1.5 volts and 3.3 volts, l=1.5 volts–5% and 3.3 volts–5%), and the third letter defines the temperature (h=105° Celsius, t=90° Celsius, l=0° Celsius).

TABLE 1

| operating condition | c0 | c1 | c2 | c3 | c4 | c5 | c6 | f0 | f1 | f2 |
|---|---|---|---|---|---|---|---|---|---|---|
| sll | 0 | 0 | 0 | 0 | 1 | 1 | 1 | 0 | 1 | 1 |
| slh | 0 | 0 | 1 | 1 | 1 | 1 | 1 | 0 | 1 | 1 |
| shl | 0 | 0 | 0 | 0 | 1 | 1 | 1 | 0 | 0 | 1 |
| shh | 0 | 0 | 1 | 1 | 1 | 1 | 1 | 0 | 0 | 0 |
| ttt | 0 | 0 | 0 | 1 | 1 | 1 | 1 | 0 | 0 | 0 |
| fll | 0 | 0 | 0 | 0 | 0 | 1 | 1 | 0 | 0 | 1 |
| flh | 0 | 0 | 0 | 0 | 1 | 1 | 1 | 0 | 1 | 1 |
| fhl | 0 | 0 | 0 | 0 | 0 | 1 | 1 | 0 | 0 | 0 |
| fhh | 0 | 0 | 0 | 0 | 1 | 1 | 1 | 0 | 0 | 1 |

For example, the line "fhl" refers to an arrangement whose operating speed is fast, whose power supply voltage is 1.5 volts and 3.3. volts, and whose operating temperature 0° Celsius. The fastest device is characterized as "fhl". Is should be noted that, in this characterization, two of the coarse branches are enabled ($c_5$ and $c_6$). The slowest device is characterized as "slh", where five coarse branches are enabled ($c_2, c_3, c_4, c_5, c_6$) and two fine branches ($f_1$ and $f_2$) are enabled. The values of the components used have been selected so that the full range of the branches is not used, e.g., to allow for future flexibility and robustness (i.e., extended temperature and voltage supply ranges).

According to one embodiment of the invention, the value of the resistors and transistors in the branches is such that four fine bits have the same effect on the overall resistance of the output buffer as one coarse bit.

Referring now to FIG. 7*a*, an alternative arrangement for a single pull-up (or pull-down) branch is shown. In this embodiment, a single control and data (N-channel) transistor 80 is connected between first resistor 72 and second resistor 78 to perform the ANDing function performed by two transistors (control transistor 74 and data transistor 76) in the branches of the arrangement shown in FIG. 6. Referring again to FIG. 7*a*, the control bit input terminal 24 and the data terminal 21 are operably connected to the transistor 80 through, e.g., a NAND gate 82 and an inverter 84.

The arrangement shown in FIG. 7*a* also is useful with a p-channel device. Such arrangement is shown, e.g., in FIG. 7*b*. In this embodiment, a single control and data (P-channel) transistor 85 is connected between first resistor 72 and second resistor 78 to perform the ANDing function. The control bit input terminal 24 and the data terminal 21 are operably connected to the transistor 85 through, e.g., a NOR gate 87 and inverter 84.

In operation, both control signal input terminal and data input terminal are used to enable transistor 80. However, the operation of the branch arrangements shown in FIGS. 7*a–b* differs from the branch arrangement shown in FIG. 6 in that the control signals and the data signals are combined logically and then applied to a single transistor.

Referring now to FIG. 8, a pull-down arrangement 90 according to embodiments of the invention includes a plurality of branches connected in parallel. The branches include, e.g., a third resistor 92, a third data transistor 94 and a fourth control transistor 96, e.g., connected as shown. The third resistor 92 is operably connected to an output rail 98 connectable to, e.g., the PAD 28. Also, the third resistor 92 is operably connected to the drain of the third data transistor 94, which, e.g., is a N-channel device. Connected to the gate of the third data transistor 94 is a $\overline{\text{data}}$ terminal, e.g., either the $\overline{\text{data1}}$ terminal or the $\overline{\text{data2}}$ terminal, depending on whether the pull-down arrangement is the first pull-down resistor arrangement 54 or the second pull-down resistor arrangement 56 (see, e.g., FIG. 3).

Referring again to FIG. 8, the source of the third data transistor 94 is connected to the drain of the fourth control transistor 96, which, e.g., also is a N-channel device. Connected to the gate of the fourth control transistor 96 is a control bit terminal 24. The source of the fourth control transistor 96 is connected to the ground voltage potential of the integrated circuit.

Within the pull-up and pull-down arrangements according to embodiments of the invention (e.g., the arrangements shown in FIGS. 6–8), the branches are similar in form. However, the size of the resistors and the transistors vary. Within a given branch, the resistors are sized for their respective resistance to be relatively large compared to the maximum resistance of the corresponding transistor(s). Also, the operable range of linearity of the device and the single fixed resistance value of the range depends on the sizing of the resistors and transistors within the arrangement branches. In this manner, the number of branches and the values of the devices within the respective branch also affects the degree of tuning (i.e., coarse and/or fine tuning) of the operable range of the device, as well as the range minimum.

For example, in the arrangement 70 shown in FIG. 6, the seven (7) coarse tuning branches contain transistors with a width of 40 μm and are controlled by the coarse control bits ($c_0$, $c_1$, $c_2$, $c_3$, $c_4$, $c_5$, $c_6$). The three (3) fine tuning branches contain transistors with a width of 10 μm, or approximately one fourth the width of the coarse tuning branch transistors. The fine tuning branch transistors are controlled by fine control bits ($f_0$, $f_1$, $f_2$). The single fixed resistance branch, which is provided to establishes a fixed base-point resistance value for the operable range, has a transistor with a width of 160 μm that is permanently enabled via its connection to $V_{DD}$.

In this arrangement, the resistors in the coarse tuning branches each have a resistance size of approximately eight (8) squares, which translates to a resistance of approximately 200 ohms each. The resistors in the fine tuning branches each have a resistance size of approximately twenty-four (24) squares each, which translates to a resistance of approximately 800 ohms each. The resistors in the single fixed resistance branch each have a resistance size of approximately 1.7 squares, which translates to a resistance of approximately 43 ohms each.

It should be kept in mind that the inventive resistor arrangements disclosed herein are useful alone or with other inventive resistor arrangements. For example, the inventive pull-up resistor arrangement 70 shown in FIG. 6 is useful with a conventional pull-down resistor arrangement or with an inventive pull-down resistor arrangement such as the pull-down resistor arrangement 90 shown in FIG. 8.

Also, according to another alternative embodiment of the invention, instead of having only one path for digital data inputs, several digital data input paths are provided. Such embodiment is shown, e.g., in FIG. 9. In this arrangement, a plurality of pull-down arrangements each having, e.g., a resistance of 4R, are connected in parallel as shown. Also, a plurality of enabling control input terminals are connected as shown.

Figure 9:
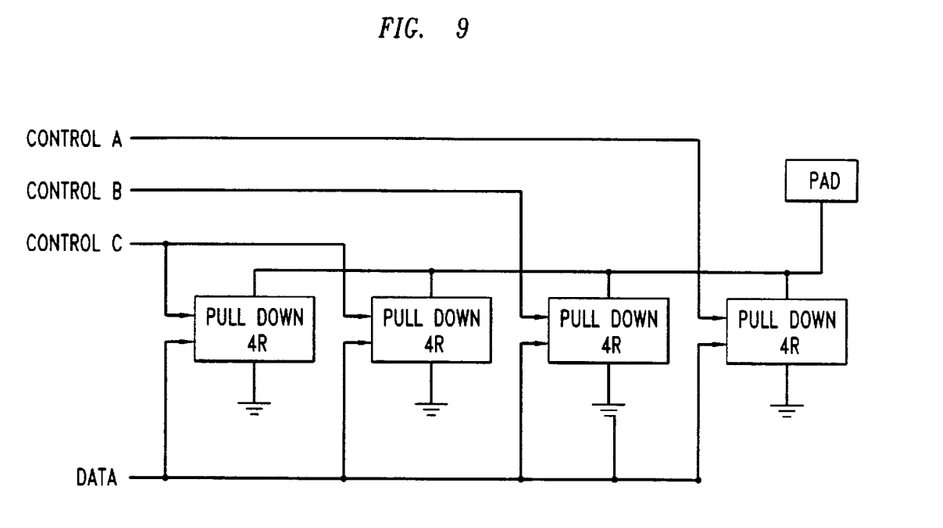
FIG. 9 is a schematic diagram of a pull-down resistor arrangement according to an alternative embodiment of the invention.

In operation, if control input terminal A is set to a logical high ("1"), the fourth pull-down arrangement is enabled and a resistance of 4R is provided. If control input terminals A and B are set to a logical high ("1"), the third and fourth pull-down arrangements are enabled and a resistance of 2R (4R in parallel with 4R) is provided. Similarly, if control input terminals A, B and C are set to a logical high ("1"), the first, second third and fourth pull-down arrangements are enabled and a resistance of R (4R in parallel with 4R in parallel with 4R in parallel with 4R) is provided. In this manner, instead of sending a binary signal, a M-array signal is sent where the various signals are a different voltage signal.

It will be apparent to those skilled in the art that many changes and substitutions can be made to the embodiments of the resistive circuit arrangements herein described without departing from the spirit and scope of the invention as defined by the appended claims and their full scope of equivalents. For example, the inventive arrangements disclosed and discussed hereinabove are useful with other types of loads (e.g., capacitive and inductive loads) in addition to transmission line loads, which typically are resistive. Also, when a pull-up arrangement is comprised of, e.g., P-channel devices, the data terminal does not have to be inverted. However, in such arrangement, the control bus should be conFIGured differently.

What is claimed is:

1. An integrated circuit output buffer, comprising:
   an output driver stage having at least one data input terminal for connection with at least one data terminal and having at least one control bit input terminal for connection with at least one control bit terminal, said output driver stage having at least one output terminal for connection with an output PAD, said output driver stage including a resistor arrangement having a plurality of coarse tuning branches coupled to said at least one data terminal,having a plurality of fine tuning branches coupled to said at least one data terminal, and having an enabled, fixed resistance branch coupled to a reference voltage to provide a fixed base-point resistance value;
   wherein each of said plurality of coarse tuning branches, each of said plurality of fine tuning branches, and said fixed resistance branch connected in parallel, comprises
   at least one resistor, said at least one resistor of a fine tuning branch having a comparatively greater resistance than said at least one resistor of a coarse tuning branch, and said at least one resistor of said fixed resistance branch having a comparatively lesser resistance than said at least one resistor of a fine tuning branch and said at least one resistor of a coarse tuning branch, and
   at least one transistor operably connected in series to said at least one resistor, said at least one transistor having a gate operably connected to one of said at least one control bit input terminal or said data input terminal.

2. The integrated circuit output buffer as recited in claim 1, wherein said resistor arrangement is a pull-down resistor arrangement, wherein said at least one resistor and said at least one transistor are operably connected in series between said output terminal of said output driver stage and a ground voltage potential of said integrated circuit output buffer.

3. The integrated circuit output buffer as recited in claim 1, wherein said resistor arrangement is a pull-up resistor arrangement, wherein said at least one resistor and said at least one transistor are operably connected in series between a supply voltage and said output terminal of said output stage.

4. The integrated circuit output buffer as recited in claim 3, wherein said at least one transistor further comprises a first pull-up control transistor and a first pull-up data transistor, wherein said first pull-up control transistor is operably connected in series to said at least one resistor and has a gate operably connected to said at least one control bit terminal, and wherein said first pull-up data transistor is operably connected in series to said first pull-up control transistor, and wherein said first pull-up data transistor has a gate operably connected to said at least one data terminal.

5. The integrated circuit output buffer as recited in claim 3, further comprising another resistor operably connected between said at least one transistor and said output terminal of said output driver stage.

6. The integrated circuit output buffer as recited in claim 1, wherein said resistor arrangement is a pull-down resistor arrangement, wherein said at least one transistor further comprises a first pull-down data transistor and a first pull-down control transistor, wherein said first pull-down data transistor is operably connected to said resistor and has a gate operably connected to at least one of said data terminals, and wherein said first pull-down control transistor is operably connected to said first pull-down control transistor and a ground voltage potential of said integrated circuit, and wherein said first pull-down data transistor has a gate operably connected to said at least one control bit terminal.

7. The integrated circuit output buffer as recited in claim 1, wherein said at least one transistor further comprises at least one N-channel device.

8. The integrated circuit output buffer as recited in claim 7, wherein at least one branch of said plurality of coarse and fine tuning branches further comprises:

an inverter operably connected to the gate of said at least one transistor, and a NAND gate having an output operably connected to said inverter and a plurality of inputs operably connected to said at least one control bit terminal and to said at least one of said data terminal.

9. The integrated circuit output buffer as recited in claim 1, wherein said at least one transistor further comprises at least one P-channel device. The integrated circuit output buffer as recited in claim 9, wherein said branch further comprises: said data terminals.

10. The integrated circuit output buffer as recited in claim 9, wherein at least one branch of said plurality of coarse and fine tuning branches further comprises:

an inverter operably connected to the gate of said at least one transistor, and a NOR gate having an output operably connected to said inverter and a plurality of inputs operably connected to said at least one control bit terminal and to said at least one data terminal.

11. The integrated circuit output buffer as recited in claim 1, wherein the resistance value of any of said at least one resistor is large compared to the resistance value of any of said at least one transistor.

12. An integrated circuit having an output buffer, said output buffer comprising:

a pre-drive stage having at least one input terminal and a plurality of output data terminals; and an output driver stage operably connected to the output data terminals of said pre-drive stage, said output driver stage having at least one control bit input terminal for connection with at least one control bit terminal and having at least one output terminal for connection with an output PAD, said output driver stage including at least one pull-up arrangement and at least one pull-down arrangement having a plurality of coarse tuning branches and a plurality of fine tuning branches, wherein said plurality of branches of said pull-up arrangement comprise a pull-up control transistor having a gate operably connected to said at least one control bit input terminal, a pull-up data transistor operably connected in series with said pull-up control transistor, said pull-up data transistor having a gate operably connected to at least one of said pre-drive stage output data terminals, and at least one first resistor operably connected in series with said pull-up data transistor and between said pull-up data transistor and said output terminal of said output driver stage, and wherein said plurality of branches of said pull-down arrangement comprise at least one second resistor operably connected to said output terminal of said output driver stage, a pull-down data transistor operably connected in series to said second resistor, said pull-down data transistor having a gate operably connected to at least one of said pre-drive stage output data terminals, and a pull-down control transistor operably connected in series with said pull-down data transistor and between said pull-down data transistor and a ground voltage potential of said integrated circuit, said pull-down control transistor having a gate operably connected to said at least one control bit input terminal.

13. The integrated circuit as recited in claim 12, wherein one or more of said pull-up data transistor, said pull-up control transistor, said pull-down data transistor and said pull-down controll transistor further comprises a N-channel device.

14. The integrated circuit as recited in claim 12, wherein one or more of said pull-up data transistor, said pull-up control transistor, said pull-down data transistor and said pull-down control transistor further comprises a P-channel device.

15. The integrated circuit as recited in claim 12, wherein the resistance value of each of first and second said resistors is large compared to the resistance value of each of said pull-up control and data transistors.

16. The integrated circuit as recited in claim 12, wherein said plurality of branches of said pull-up arrangement further comprise at least one third resistor operably connected in series with said pull-up control transistor and between a supply voltage and said pull-up control transistor.

* * * * *